(12) United States Patent
Girtman

(10) Patent No.: US 9,365,366 B2
(45) Date of Patent: Jun. 14, 2016

(54) ROBOTIC CONTAINER REORGANIZER

(71) Applicant: Intelligrated Headquarters LLC, Mason, OH (US)

(72) Inventor: Michael Girtman, O'Fallon, MO (US)

(*) Notice: Subject to any disclaimer, the term of this patent is extended or adjusted under 35 U.S.C. 154(b) by 50 days.

(21) Appl. No.: 14/313,226

(22) Filed: Jun. 24, 2014

(65) Prior Publication Data

US 2014/0377049 A1    Dec. 25, 2014

Related U.S. Application Data

(60) Provisional application No. 61/838,765, filed on Jun. 24, 2013.

(51) Int. Cl.
| | | |
|---|---|---|
| *B65B 21/20* | (2006.01) | |
| *B65B 21/00* | (2006.01) | |
| *B65G 47/90* | (2006.01) | |
| *B65G 47/91* | (2006.01) | |
| *H01L 21/687* | (2006.01) | |
| *B25B 11/00* | (2006.01) | |
| *B25J 15/00* | (2006.01) | |

(52) U.S. Cl.
CPC ............ *B65G 47/907* (2013.01); *B25B 11/007* (2013.01); *B25J 15/0061* (2013.01); *B65B 21/20* (2013.01); *B65G 47/918* (2013.01); *H01L 21/68707* (2013.01); *B65G 2201/0238* (2013.01)

(58) Field of Classification Search
CPC .. B25J 15/0616; B25J 15/0061; Y10S 901/40
USPC ............... 294/87.1, 87.2, 87.26; 414/416.02, 414/752.1, 791.7, 792.9, 793, 796.5, 796.9, 414/797, 797.1, 799, 931; 53/247, 543
See application file for complete search history.

(56) References Cited

U.S. PATENT DOCUMENTS

| | | | | |
|---|---|---|---|---|
| 3,300,945 | A * | 1/1967 | Grossi ..................... | B65B 25/16 414/133 |
| 3,487,959 | A * | 1/1970 | Pearne .................... | B65G 59/02 294/63.1 |
| 3,601,266 | A * | 8/1971 | Pearne ................... | B65G 59/02 414/796 |
| 3,776,398 | A * | 12/1973 | Stuart .................... | B65G 59/02 414/788.6 |
| 3,831,992 | A * | 8/1974 | Francois ............... | B66C 1/0212 294/65 |
| 3,920,128 | A * | 11/1975 | Baker ................... | B65G 47/918 198/468.4 |
| 4,444,424 | A * | 4/1984 | Lebret .................... | B65B 21/20 198/434 |
| 4,901,504 | A * | 2/1990 | Tsuji ....................... | B65B 21/18 53/247 |
| 5,060,455 | A * | 10/1991 | Schmeisser ............ | B65B 21/18 53/247 |
| 5,553,442 | A * | 9/1996 | Fadaie .................. | B65B 25/146 414/404 |
| 6,589,008 | B1 * | 7/2003 | Ingraham ............. | B65G 47/907 198/468.3 |
| 7,641,438 | B2 * | 1/2010 | Jaspers .................. | B65G 47/91 221/211 |

(Continued)

*Primary Examiner* — Gregory Adams

(57) ABSTRACT

A robotic container reorganizer has a robot arm that holds a robotic tool. The robotic tool can reconfigure a plurality of articles from a first configuration to a second configuration. The robotic arm may pick up a collection of articles in a first configuration with the robotic tool, and may reconfigure the articles with the robotic tool into a second configuration. The second configuration of articles may be set down after reconfiguration. The first configuration of articles has a first width and a first length, and the second configuration has a second length and a second width. The first width and the first length of the first configuration differ from the second width and the second length of the second configuration.

13 Claims, 16 Drawing Sheets

(56) References Cited

U.S. PATENT DOCUMENTS

| | | | |
|---|---|---|---|
| 7,690,706 B2* | 4/2010 | Wild | B65G 47/907 198/468.3 |
| 8,037,996 B2* | 10/2011 | Cheng | B65G 47/91 198/468.3 |
| 2008/0075574 A1* | 3/2008 | Ahn | H05K 13/0408 414/752.1 |
| 2009/0049801 A1* | 2/2009 | Hagenbrock | B65B 21/12 53/445 |
| 2010/0212265 A1* | 8/2010 | Junghans | B65G 47/918 53/448 |
| 2012/0039699 A1* | 2/2012 | Ward | B25J 15/0052 414/792.7 |
| 2012/0112483 A1* | 5/2012 | Chen | B25B 11/007 294/87.1 |
| 2013/0038077 A1* | 2/2013 | Hummeler | B65B 35/38 294/183 |
| 2014/0119875 A1 | 5/2014 | Job et al. | |

* cited by examiner

ROBOTIC CONTAINER REORGANIZER

PRIORITY

This application claims priority to U.S. Provisional Patent Application Ser. No. 61/838,765, filed Jun. 24, 2013, entitled "Robotic Container Reorganizer," the entire contents of which are incorporated by reference herein.

BACKGROUND

The present disclosure relates generally to tools for a robotic arm, and is more particularly directed to a robotic tool that can pick up a plurality of articles in one configuration and reorganize the articles into a second configuration.

Robotic arms are components of high volume distribution and fulfillment operations, and can perform complicated tasks such as placing, stacking, and/or un-stacking articles for transit. In product distribution, it can be desirable to take articles, such as cans and/or bottles, that are received in one configuration and to reorganize the articles into a second configuration for packing and/or unpacking of the articles. For example, articles such as containers may emerge from a filling line in a first configuration of two parallel rows. The containers can be picked up in the first configuration, reorganized into a second configuration of four rows, and moved to another location, such as placed into a low sided carton on another conveyor line for wrapping and delivery to a truck. Accordingly, described herein is a tool for a robotic arm that can pick up articles in one configuration and deliver them to another area in a second, different configuration.

BRIEF DESCRIPTION OF THE FIGURES

The accompanying drawings, which are incorporated herein and constitute part of this specification, illustrate exemplary embodiments of the invention, and, together with the general description given above and the detailed description given below, serve to explain the features of the present invention.

DETAILED DESCRIPTION

Figure 1:
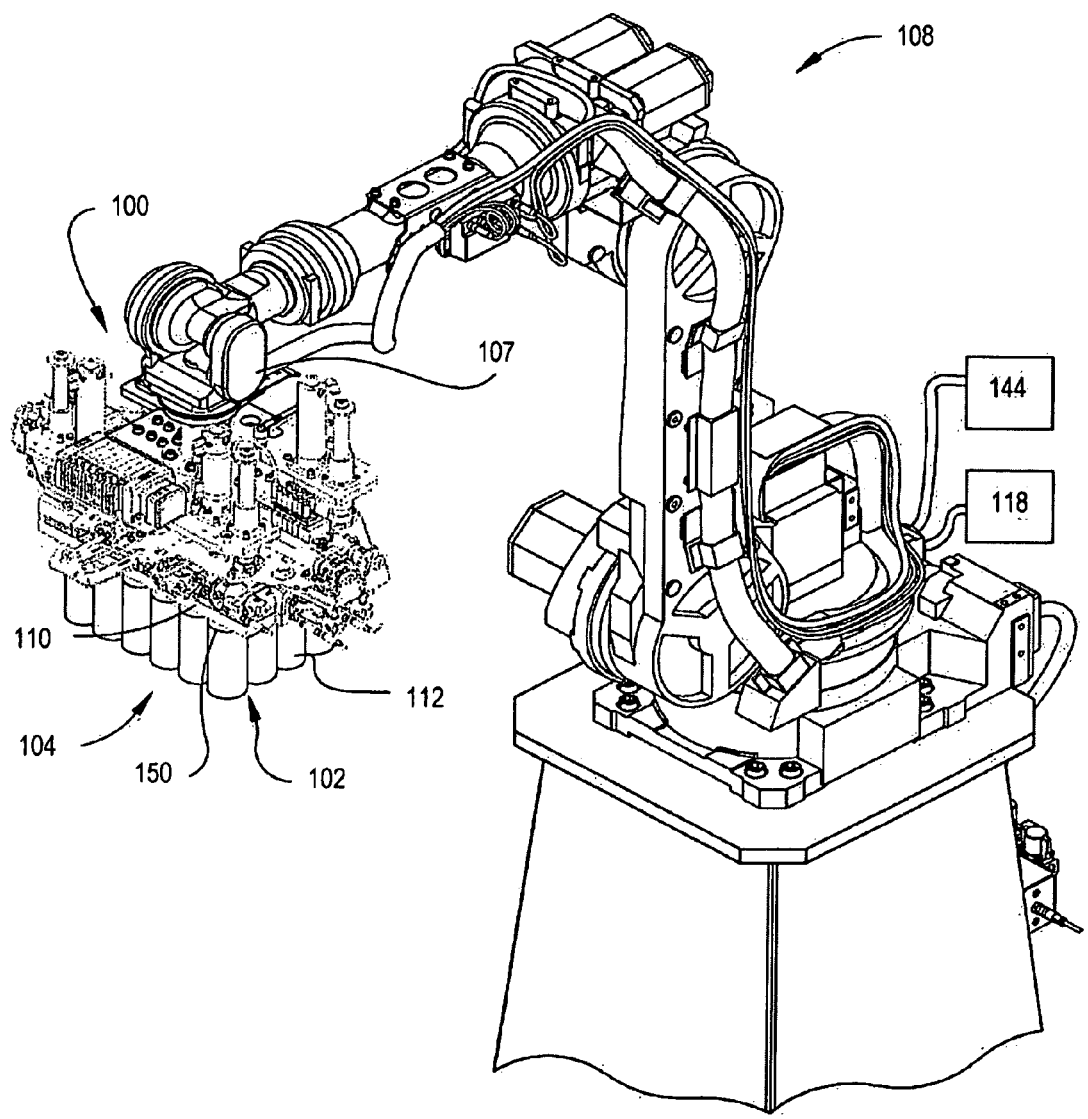
FIG. 1 is a front isometric view of a robotic tool attached to a robotic arm.

In the following description, like reference characters designate like or corresponding parts throughout the several views. Also, in the following description, it is to be understood that terms such as front, back, inside, outside, and the like are words of convenience and are not to be construed as limiting terms. Terminology used in this patent is not meant to be limiting insofar as devices described herein, or portions thereof, may be attached or utilized in other orientations.

It should be appreciated that any patent, publication, or other disclosure material, in whole or in part, that is said to be incorporated by reference herein is incorporated herein only to the extent that the incorporated material does not conflict with existing definitions, statements, or other disclosure material set forth in this disclosure. As such, and to the extent necessary, the disclosure as explicitly set forth herein supersedes any conflicting material incorporated herein by reference.

The word "exemplary" is used herein to mean "serving as an example, instance, or illustration." Any implementation described herein as "exemplary" is not necessarily to be construed as preferred or advantageous over other implementations.

Figure 3:
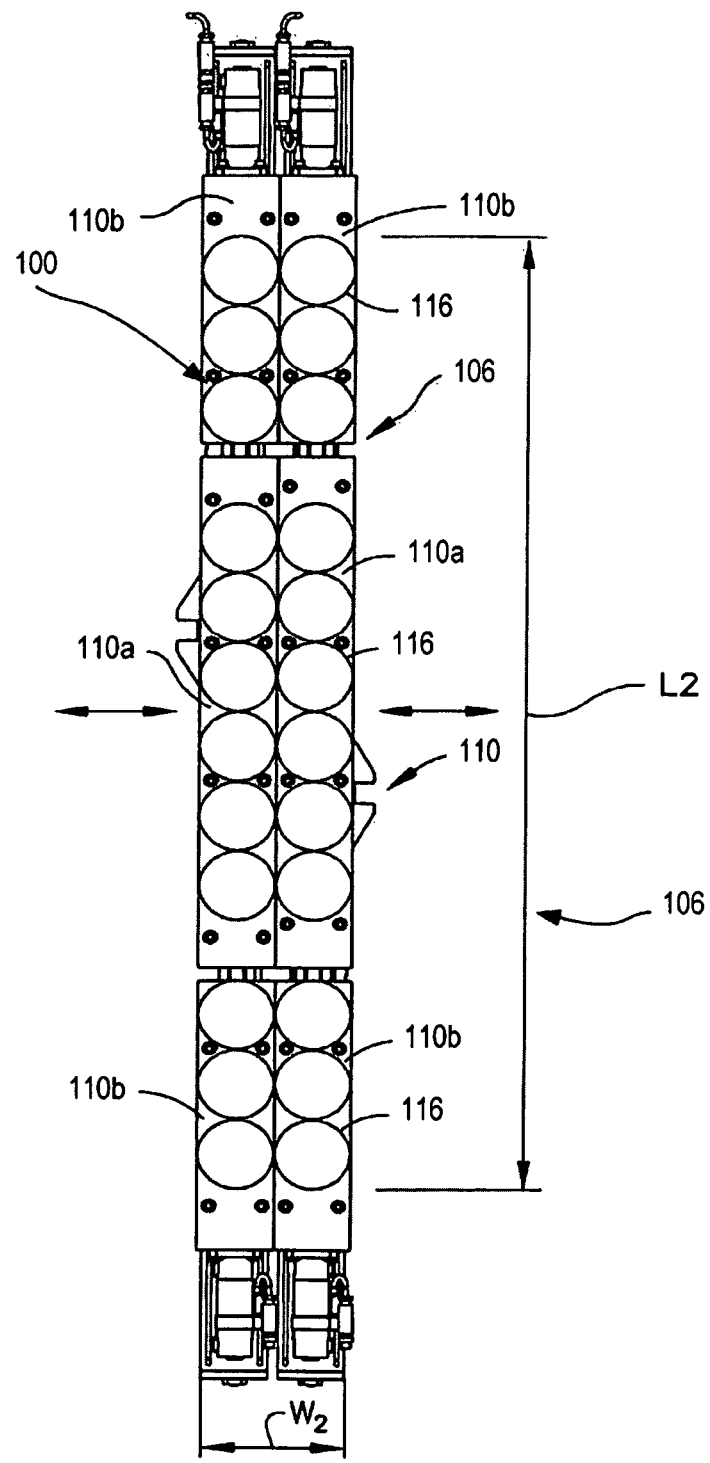
FIG. 3 is a bottom view of the robotic tool of FIG. 1 in a second configuration.

Referring to the drawings, FIG. 1 shows a robotic tool 100 for reconfiguring articles 102 from a first configuration 104 to a second configuration 106 (FIG. 3). Robotic tool 100 or end effector is attached to a moving end 107 of a robotic arm 108 that can move robotic tool 100 to almost any position within a hemispherical reach of robotic arm 108. As will be illustrated later, robotic arm 108 can move robotic tool 100 to a first location to pick up articles 102 in first configuration 104, and can move robotic tool 100 and articles 102 to a second location where the articles 102 can be placed down in a second configuration 106 (FIG. 3). This reconfiguring process is explained in detail below and can include rotating robotic tool 100 with robotic arm 108. Robotic arm 102 can be any conventionally available multi-axis robotic arm such as, for an example, a six axis of movement FANUC™ Robot R-1000ia sold by FANUC™ Robotics America Corporation, 3900 West Hamlin Road, Rochester Hills Mich. 48309-3253.

In FIG. 1, robotic tool 100 is shown holding a plurality of articles 102 in the first configuration 104 with a plurality of grippers gripper assemblies 110.

Figure 2:
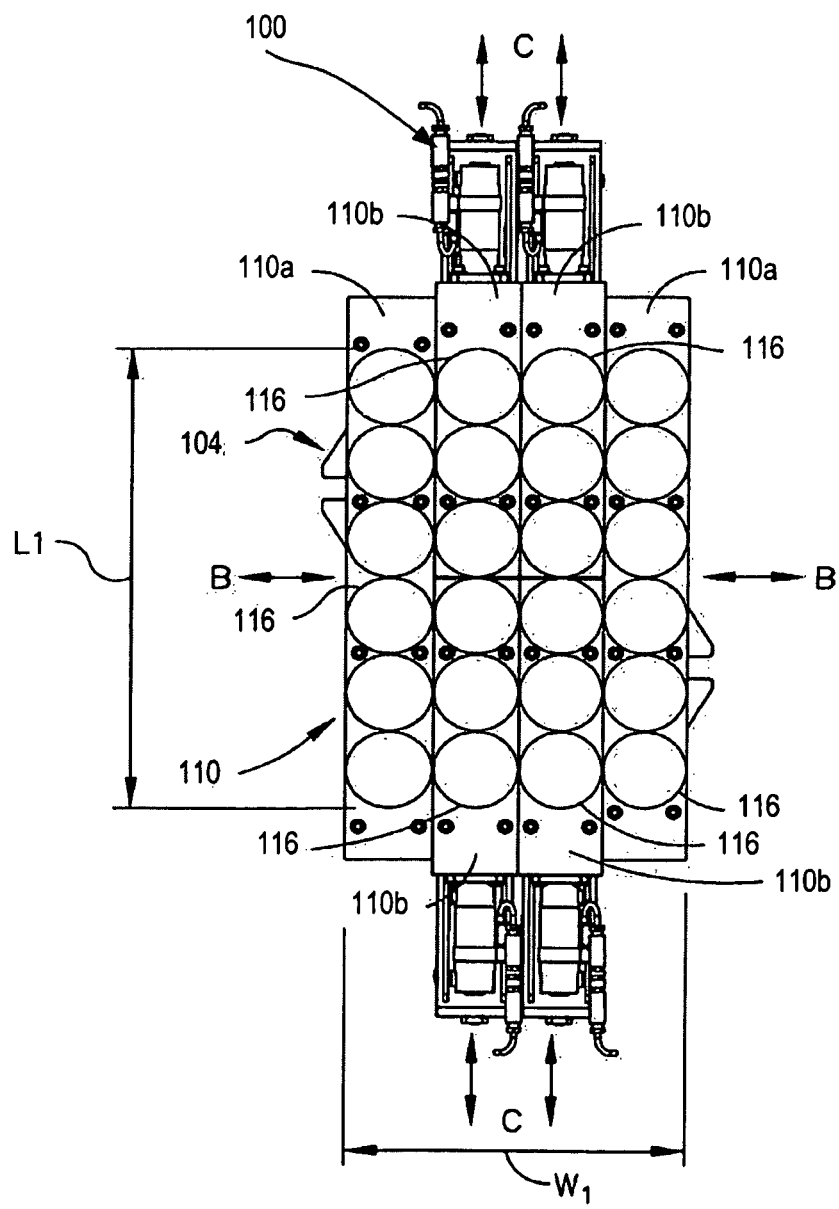
FIG. 2 is a bottom view of the robotic tool of FIG. 1 in a first configuration.

By way of illustration, a configuration of articles 102 can be a fixed number of articles 102 placed into a pattern or array. A reconfiguration of articles 102 can be a reorganization of the articles 102 into a new array or pattern. The first configuration 104 of articles 102 is shown in FIGS. 1 and 2, and can comprise an array of twenty four articles 102 arrayed as four rows of six articles 102 as a packaged array 112. FIG. 3 shows the second configuration 106 where the gripper assemblies 110 have reconfigured the twenty four articles 102 into the second configuration 106 comprising two rows of twelve articles 102 in a conveyed array 114.

Turning to FIG. 2, a bottom view of robotic tool 100 is shown in the first configuration 104. The bottom of robotic tool 100 can comprise a plurality of gripper assemblies 110 that are independently movable towards and away from each other. Gripper assemblies 110 can comprise a first gripper assembly 110a and a second gripper assembly 110b, each with a plurality of gripping tools 116 attached to the bottom thereof. First gripper assemblies 110a can comprise a row of six gripping tools 116 that also comprise the outside rows of gripping tools 116 of the first configuration 104. When reconfiguring, first gripper assemblies 110a may independently move towards and away from each other in the directions as shown by directional arrows B. Second gripper assemblies 110b can each comprise three gripping tools 116 attached thereto. In FIG. 2, two second gripper assemblies 110b are shown brought together end to end to comprise a full row of six gripping tools 116. Second gripper assemblies 110b can also define at least one inner row of six gripping tools 116 located between the outer rows of gripping tools 116. Gripper assemblies 22a and 22b 110a-110b are described as having six gripping tools 116 and three gripping tools 116 respectively, but the number of gripping tools 116 attached to first and second gripper assemblies 110a-110b are not limited thereto. When reconfiguring, second gripper assemblies 110b can be moved towards and away from each other in the directions indicated by directional arrows C. A plane of motion is defined by the movement of first gripper assembly 110a and second gripper assembly 110b. This plane, henceforth referred to as B-C plane, is not shown but is defined by transversely oriented directional arrows B and directional arrows C. During reconfigurations first and second gripper assemblies 110a-110b can move towards and away from each other along the B-C plane. Plane B-C can be horizontal.

Robotic tool 100 comprises a plurality of gripper assemblies 110 for grasping plurality of articles 102. Gripper assemblies 110 may use vacuum to hold plurality of articles 102, but gripper assemblies 110 are not limited thereto. For instance, vacuum from a vacuum source 118 (see FIG. 1) can be applied to gripper assemblies 110a-110b through gripping tools 116 to grasp the at least one article 102 with vacuum. Other methods to releasably engage articles 102 will be apparent to one with ordinary skill in the art in view of the teachings herein. In some versions, gripping tools 116 may comprise movable components to squeeze and/or release articles 102 from robotic tool 100. In still other versions, vacuum may be selectively applied to each individual gripping tool 116 such that robotic tool 100 can selectively pick up any number of articles 102.

As seen in FIG. 2, first gripper assemblies 110a and second gripper assemblies 110b may be brought together in juxtaposition to hold articles 102 in first configuration 104. First configuration 104 has a first length L1 and a first width W1 as measured across the outside. As shown in FIG. 3, robotic tool 100 is operable to translate gripper assemblies 110a-110b, which thereby reorganizes articles 102 from first configuration 104 into second configuration 106. One or both gripper assemblies 110a-110 b may translate to reorganize articles 102 such that second gripper assembly 110b is moveable relative to first gripper assembly 110a. In some versions, gripper assemblies 110a-110b may be rotatable. Second configuration 106 includes a second length L2 and a second width W2 that are different than first length L1 and first width W1 of first configuration 104. For instance, the present embodiment shows a first configuration 104 comprising six columns and four rows and second configuration 106 comprises twelve (12) columns and two (2) rows. Rows can be parallel and columns can be parallel. As will be apparent to one with ordinary skill in the art in view of the teachings herein, other suitable configurations can be used with any other suitable number of articles 102. In some versions, more than one layer of articles 102 may be placed onto a previous layer of articles 102 to build up multi-layer configurations. Additionally, gripper assemblies 110 and/or robotic tool 100 can be configured to be easily adapted and reprogrammed to handle different amounts of articles 102, different configurations of articles 102, multi-layers of articles 102, and/or different sizes of articles 102.

Figure 4:
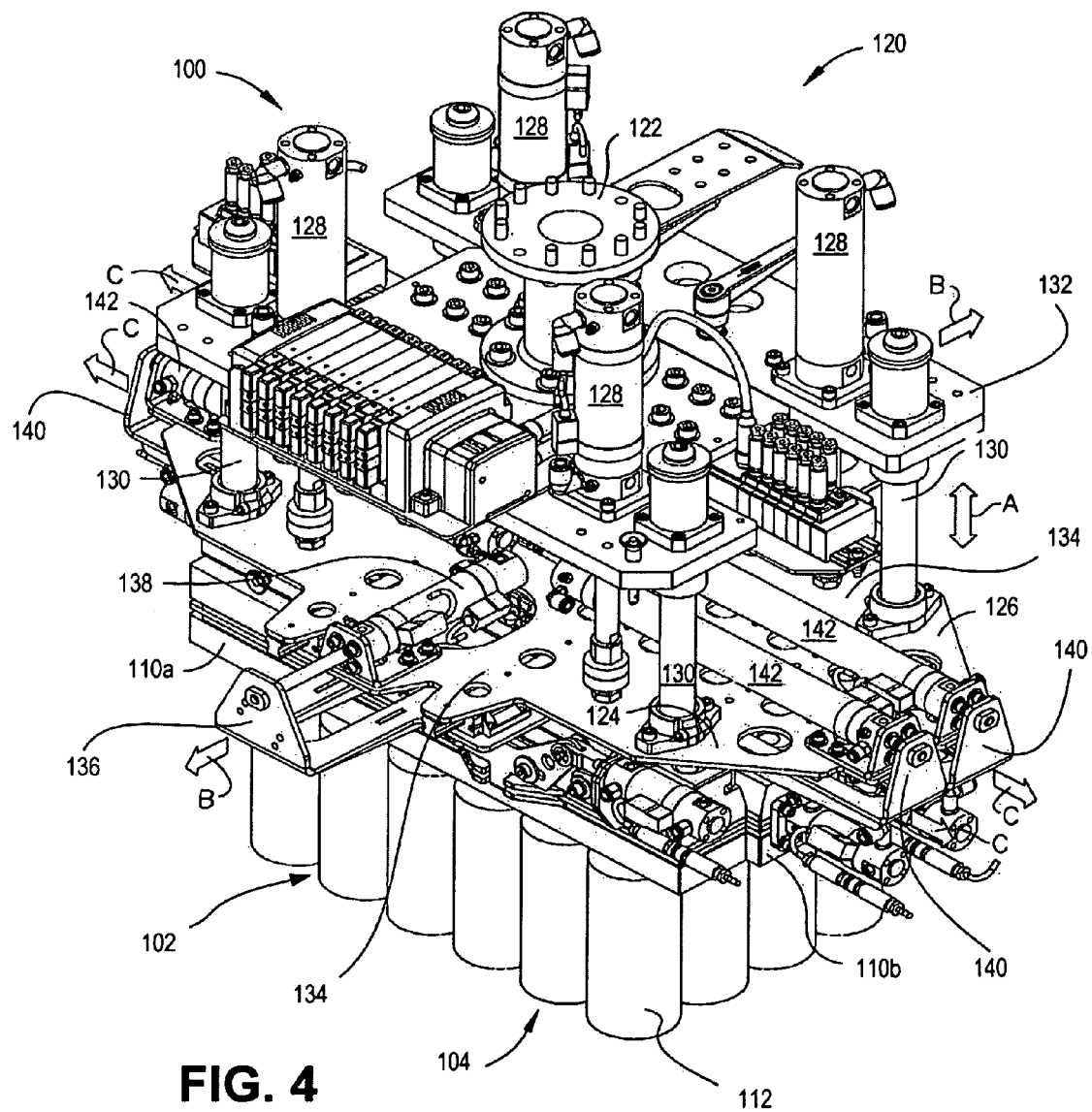
FIG. 4 is an isometric view of the robotic tool of FIG. 1, holding the plurality of articles.

FIG. 4 shows robotic tool 100 in the first configuration 104. Robotic tool 100 comprises an upper head assembly 120 that is attached to robotic arm 108 (FIG. 1) by a tool flange 122. A first pickup assembly 124 and a second pickup assembly 126 are movably attached to the upper head assembly 120 and can be moved up and down vertically (see arrow A) relative to the upper head assembly 120 with pickup actuators 128. Each of the first pickup assembly 124 and the second pickup assembly 126 may be located parallel to each other and each can be moved up and down in the vertical direction independently from the other in an "A" direction. A pair of pickup guides 130 are attached to a top mounting structure 132 of the respective first and second pickup assemblies 124, 126 and engage for sliding vertical movement a respective vertically-positionable left and right lower mounting structures 134. Pickup guides 130 guide the first pickup assembly 124 and the second pickup assembly 126 during the vertical motion caused by a respective pair of pickup actuators 128, and may limit travel.

Each of the first pickup assembly 124 and the second pickup assembly 126 has respective an outer full-row first gripper 140 assembly 110a and two half-row second gripper assemblies 110b mounted to an underside of the lower mounting structure 134 thereof, and each can pick up or place down articles 102 independently. Each outer full-row first gripper assembly 110a is attached to a lateral horizontal guide 136 that is in turn attached for horizontal, lateral sliding motion to the lower mounting structure 132 of the respective pickup assembly 124, 126. A side first actuator 138 positions the lateral horizontal guide 136 to horizontally and laterally translate the outer full-row first gripper assembly 110a in a "B" direction that is orthogonal to the "A" direction and between an outer row position to an inner row position. For each of pickup assemblies 124, 126, the two half-row second gripper assemblies 110b are longitudinally aligned in the inner row position attached to respective longitudinal guides 140. Each longitudinal guide 140 is in turn attached for horizontal, longitudinal sliding motion to a respective lower mounting structure 134 in a "C" direction that is orthogonal to both the A and B directions. Each longitudinal guide 140 is positioned by a respective longitudinal second actuator 142 either together or spaced longitudinally apart to allow the outer full-row gripper assembly 110a to move in alignment there between.

First gripper assemblies 110a and second gripper assemblies 110b define the bottom of robotic tool 100 and can be seen in at least FIGS. 2 and 3. First and second gripper assemblies 110a-110b may be extended from and retracted back towards first and second pickup assemblies 124 126 along directional arrows B and C. Whereas arrows B and C show outward directions from first and pickup assemblies 124 126 first and second gripper assemblies 110a-110b are movable inwards in the directions shown by directional arrows B and C. Gripper assemblies 110a-110b may differ in the maximum number of articles 102 that can be picked up with a respective gripper type.

First gripper assembly 110a may be coupled to both first pickup assembly 124 and second pickup assembly 126 such that robotic tool 100 may include a pair of first gripper assemblies 110a. As best seen in FIGS. 2 and 3, each first gripper assembly 110a may comprise a row of six gripping tools 116. Other suitable numbers of first gripper assemblies 110a and/or gripping tools 116 will be apparent to one with ordinary skill in the art in view of the teachings herein. In the present embodiment, first gripper assemblies 110a may be moveable inwardly and/or outwardly along a second axis B, as shown in FIG. 4, but other suitable directions may be used. Axis B is transversely located relative to axis A. At least one actuator, such as first actuator 138, is coupled with each of first gripper assemblies 110a to translate first gripper assemblies 110a away from and towards each other and along directional arrow B. Each of first gripper assemblies 110a may be independently moveable.

Robotic tool 100 further may comprise a more than one second gripper assembly 110b such that one pair of second gripper assemblies 110b may be coupled to first pickup assembly 124 and the other pair of second gripper assemblies 110b may be coupled to second pickup assembly 126. As best seen in FIGS. 2 and 3, each second gripper assembly 110b may comprise a row of three gripping tools 116. Other suitable numbers of second gripper assemblies 110b and/or gripping tools 116 will be apparent to one with ordinary skill in the art in view of the teachings herein. In the present embodiment, second gripper assemblies 110b may be movable inwardly and/or outwardly along third axis C, as shown in FIG. 4, but other suitable directions may be used. Axis C can be oriented vertically and may be transversely located relative to axis A and axis B. At least one actuator, such as second actuator 142, is coupled with second gripper assembly 110b to translate second gripper assembly 110b in the direction indicated by directional arrows C. Each of second gripper assemblies 110b can be independently movable.

Turning back to FIGS. 2 and 3, first gripper assemblies 110a are in an outer position and second gripper assemblies 110b are in an inner position in first configuration 104 such that second gripper assemblies 110b are positioned between first gripper assemblies 110a. Second actuators 142 may be actuated to translate second gripper assemblies 110b outwardly along axis C. First actuators 138 may be actuated to translate first gripper assemblies 110a inwardly along axis B. This positions first and second gripper assemblies 110a-110b in a second configuration 106. In the second configuration 106, first gripper assemblies 110a are adjacent to each other and a pair of second gripper assemblies 110b are adjacent the ends of each first gripper assembly 110a. First actuator 138 may then translate first gripper assemblies 110a outwardly along axis B and second actuator 142 can translate second gripper assemblies 110b inwardly along axis C to return first and second gripper assemblies 110a-110b to first configuration 104. In FIG. 1, controller 144 is shown coupled with robotic tool 100 and with robotic arm 108. Controller 144 may control positional movement of robotic arm 108, gripper assemblies 110a-110b, first pickup assembly 124, and second pickup assembly 126. Controller 144 may also translate second gripper assembly 110b relative to first gripper assembly 110a. For instance, controller 144 may be configured to actuate first and second actuators 138 142 to translate gripper assemblies 110a-110b. Controller 144 may further be configured to actuate pickup actuators 128 to translate first and second pickup assemblies 124 126. Controller 144 can thereby reorganize articles 102 between first configuration 104 and second configuration 106. Controller 144 can also reposition gripper assemblies 110a-110b to other configurations, and can be re-programmed. Controller 144 can typically include a processor coupled to volatile memory and a large capacity nonvolatile memory, such as a disk drive of Flash memory. Controller 144 may also include a floppy disc drive and a compact disc (CD) drive coupled to the processor. Controller 144 may also include a number of connector ports coupled to the processor for establishing data connections or receiving external memory devices, such as a USB or FireWire™ connector sockets, or other network connection circuits for establishing network interface connections from the processor to a network or bus, such as a local area network coupled to other computers and servers, the Internet, the public switched telephone network, and/or a cellular data network. The computing controller 144 may also include the trackball or touch pad, keyboard, and display all coupled to the processor. The various embodiments of controller 144 may also be implemented on any of a variety of commercially available server devices.

The processors above may be any programmable microprocessor, microcomputer or multiple processor chip or chips that can be configured by software instructions (applications) to perform a variety of functions, including the functions of the various embodiments described above. In some devices, multiple processors may be provided, such as one processor dedicated to wireless communication functions and one processor dedicated to running other applications. Typically, software applications may be stored in the internal memory before they are accessed and loaded into the processors. The processors may include internal memory sufficient to store the application software instructions. In many devices the internal memory may be a volatile or nonvolatile memory, such as flash memory, or a mixture of both. For the purposes of this description, a general reference to memory refers to memory accessible by the processors including internal memory or removable memory plugged into the device and memory within the processors themselves.

Figure 5:
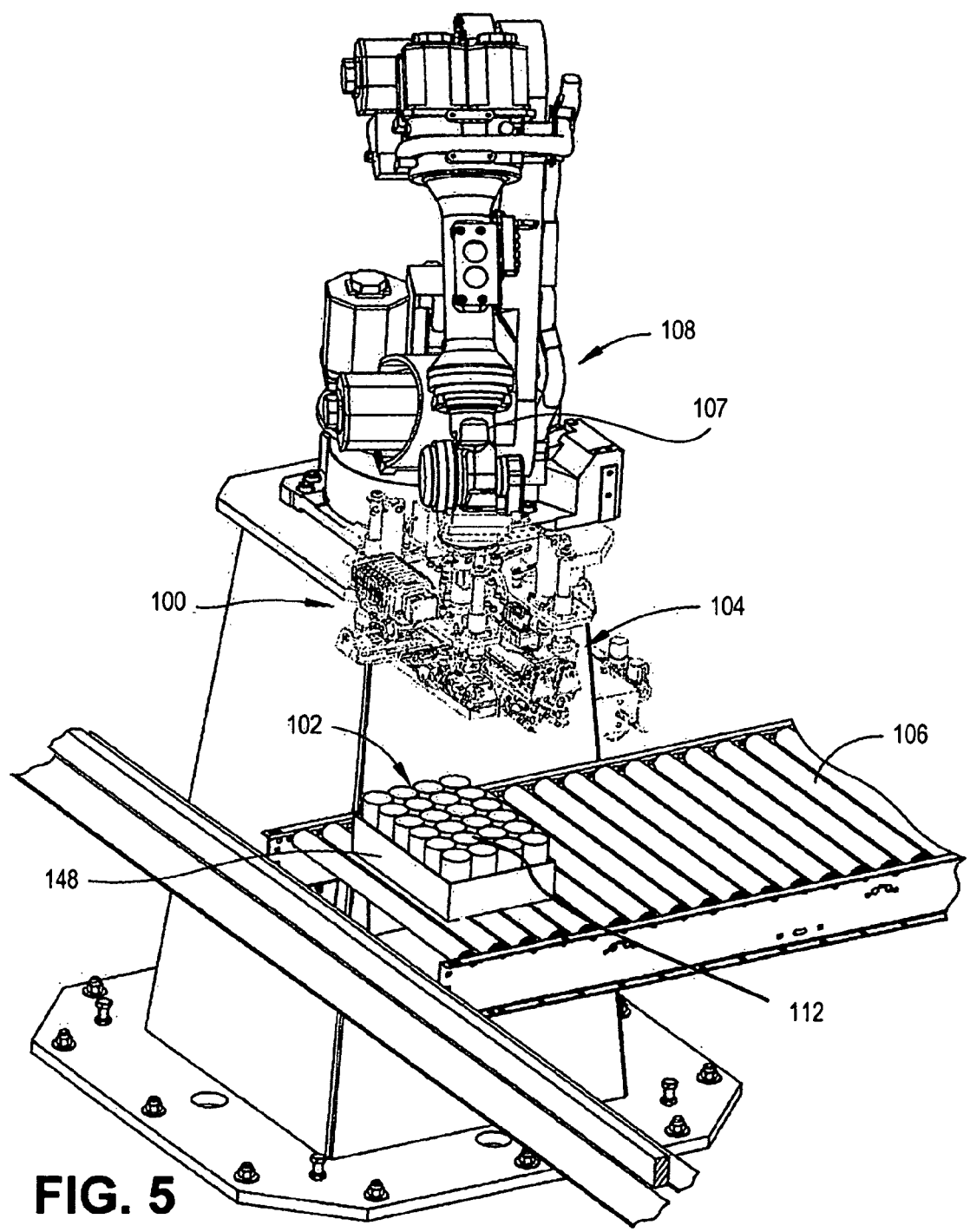
FIG. 5 is an isometric view of the robotic arm of FIG. 1 positioning the robotic tool of FIG. 1 adjacent to the plurality of articles.

FIGS. 5-14 show a series of steps in the sequence of robotic tool 100 and robotic arm 101 picking up a plurality of articles in the first configuration 104, reorganizing the articles 102 to the second configuration 106 and then placing the articles 102 down. FIG. 5 begins the sequence and shows robotic arm 108 positioning robotic tool 100 over first conveyor 146 that holds a plurality of articles 102. The plurality of articles 102 are stored in package 148, such as a carton, in first configuration 104.

Figure 6:
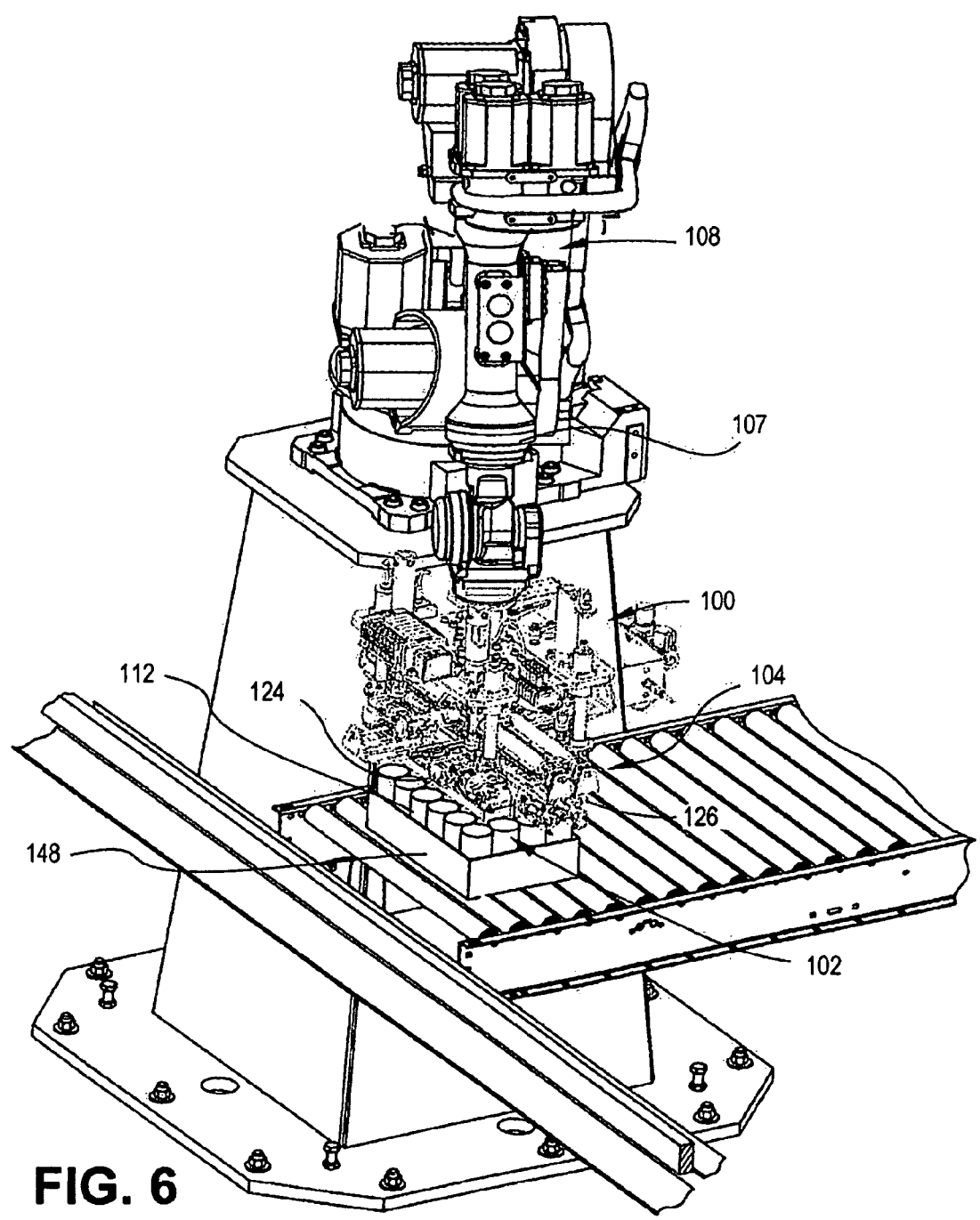
FIG. 6 is an isometric view of the robotic tool of FIG. 5 moving toward the plurality of articles.

As shown in FIG. 6, robotic arm 108 may lower robotic tool 100 to a position over the plurality of articles 102 stored in package 148 in the first configuration 104. Robotic tool 100 is reconfigured to first configuration 104 to match the first configuration of articles 102 in package 148. Pickup actuators 32128 are actuated to extend first pickup assembly 124 and/or second pickup assembly 126 from robotic tool 100 in a vertical or down direction toward the plurality of articles 102, as shown in FIG. 6. Gripping tools 116 of gripper assemblies 110a-110b may be brought into engagement with articles 102. Each gripping tool 116 of gripper assembly 110a-110b may then be actuated to grip at least one article 102 with a respective engaged gripping tool 116. For instance, vacuum may be applied through gripping tools 116 to hold articles with gripping tools 116. Gripping tools 116 can include a grip 150 (FIG. 1) to seal with articles, and the grip 150 can be an insert configured for easy replacement.

Figure 7:
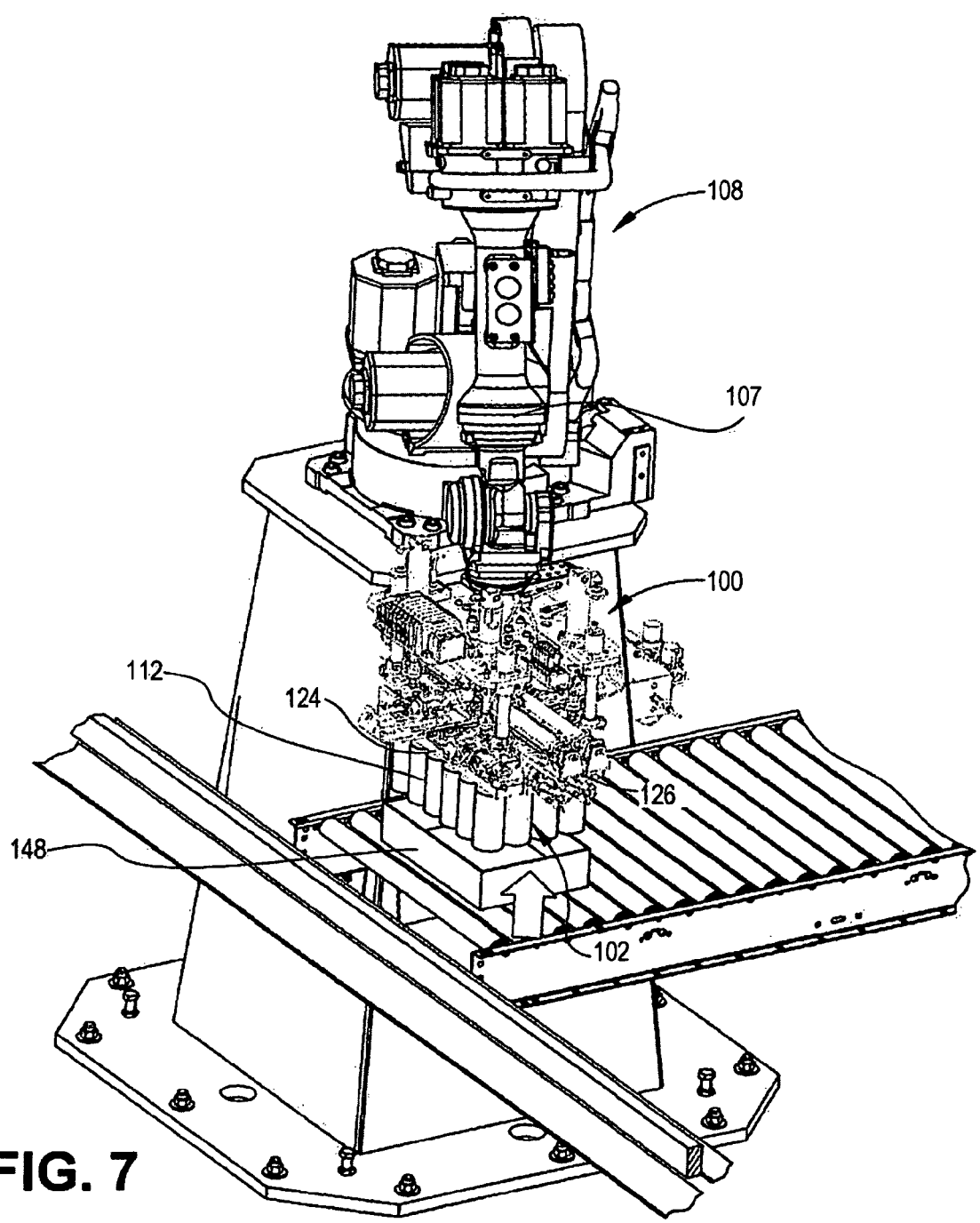
FIG. 7 is an isometric view of the robotic tool of FIG. 5 lifting the plurality of articles in a first configuration.
Figure 8A:
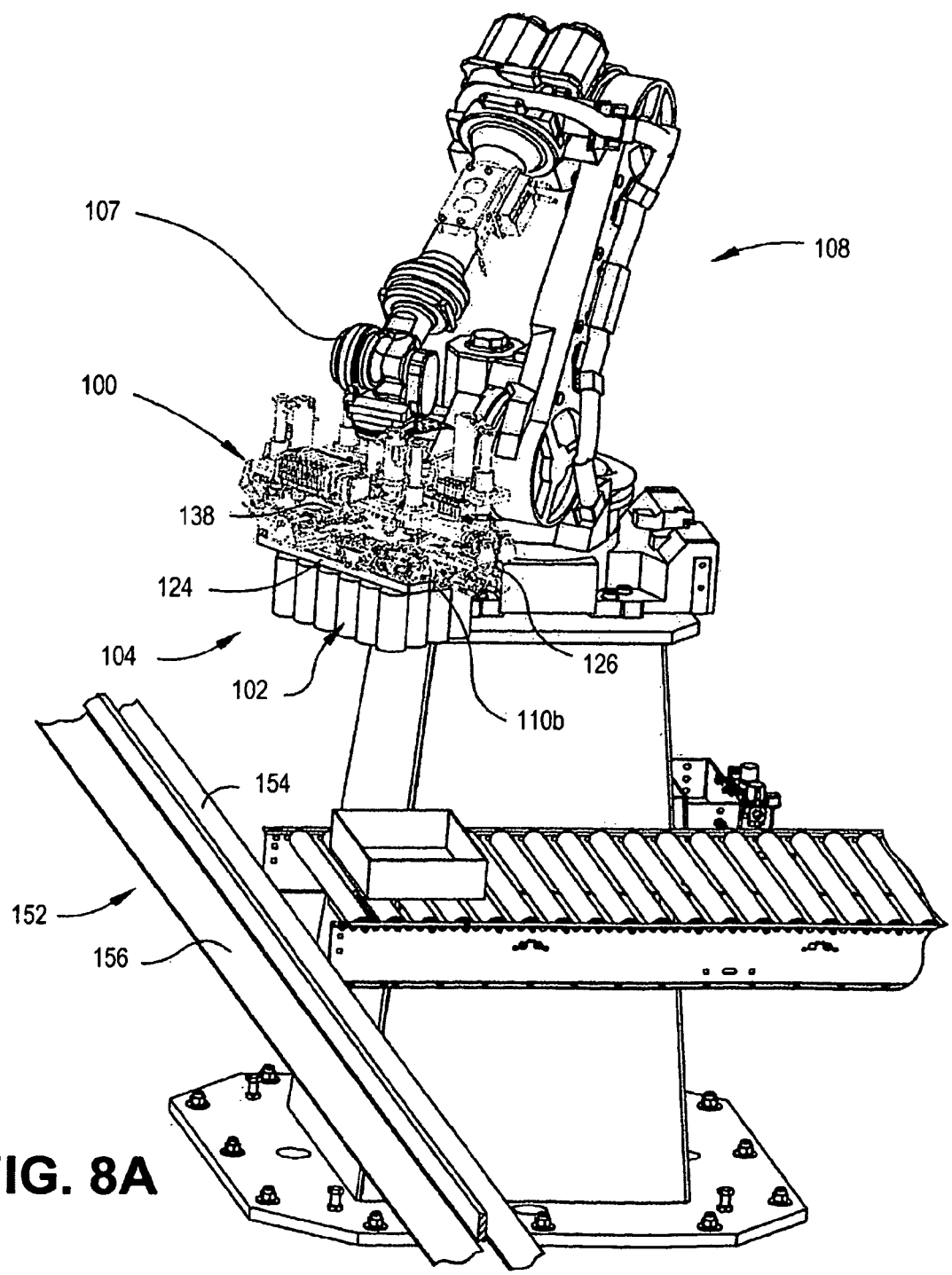
FIG. 8A is an isometric view of the robotic tool of FIG. 5 transferring the plurality of articles and reconfiguring the plurality of articles.
Figure 8B:
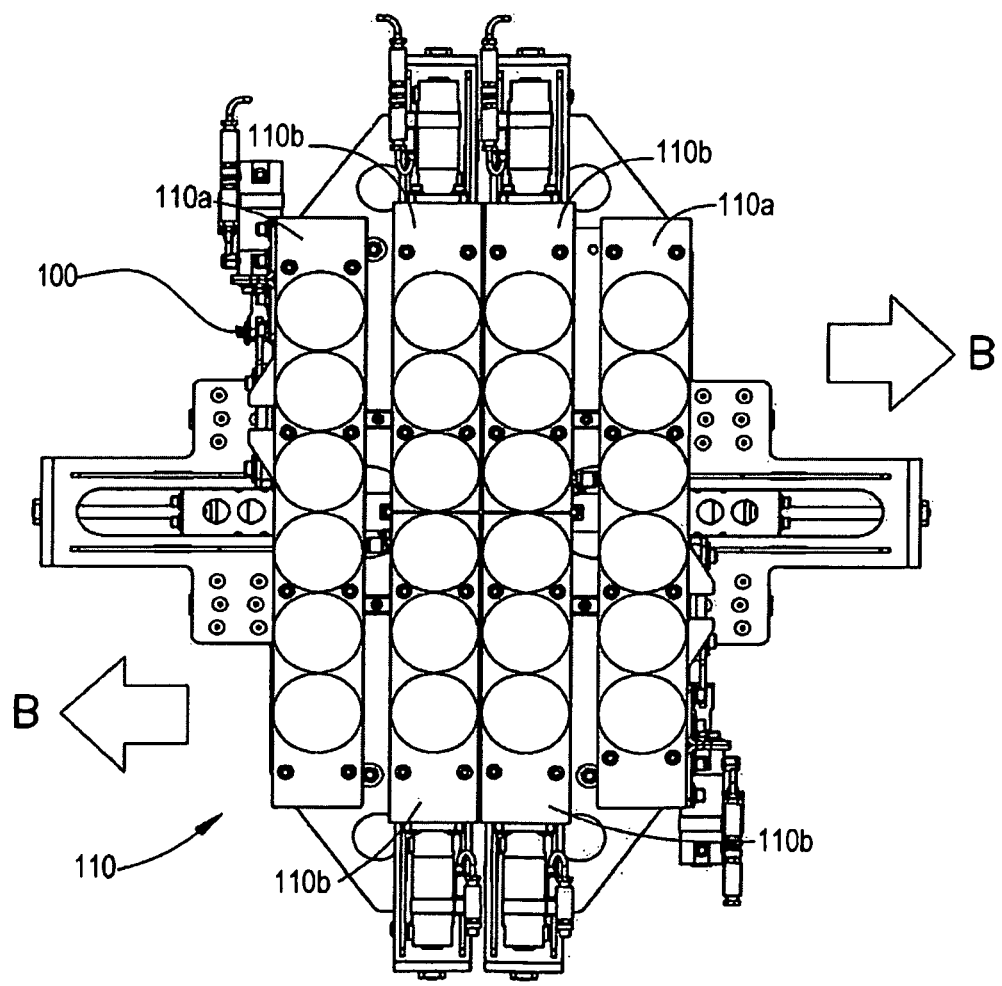
FIG. 8B is a bottom view of the robotic tool of FIG. 8A showing the robotic tool reconfiguring the plurality of articles.

In FIG. 7, robotic arm 108 is shown lifting robotic tool 100 and gripped articles 102 in the upward direction indicated by the arrow from first conveyor 146 and/or package 148. Both first pickup assembly 124 and second pickup assembly 126 are shown in the extended position in FIG. 7. In FIG. 8A, robotic arm 108 has lifted robotic tool 100 up and is swinging robotic tool 100 in a clockwise direction from first conveyor 146 towards second conveyor 152. In the present embodiment, pickup actuators 128 have been actuated to retract first pickup assembly 124 and/or second pickup assembly 126 inwardly toward robotic tool 100 with the plurality of articles 102 held within first gripper assemblies 110a and second gripper assemblies 110b. In FIGs. 8A and 8B, the pair of side first actuators 138 have been actuated to move the pair of six row gripper assemblies 110a outwards and away from the second gripper assemblies 110b along directional arrows B. FIG. 8B is a bottom view of the robotic tool 100 of FIG. 8A and the directional arrows B are shown extending outwards from second gripper assemblies 110a.

Figure 9A:
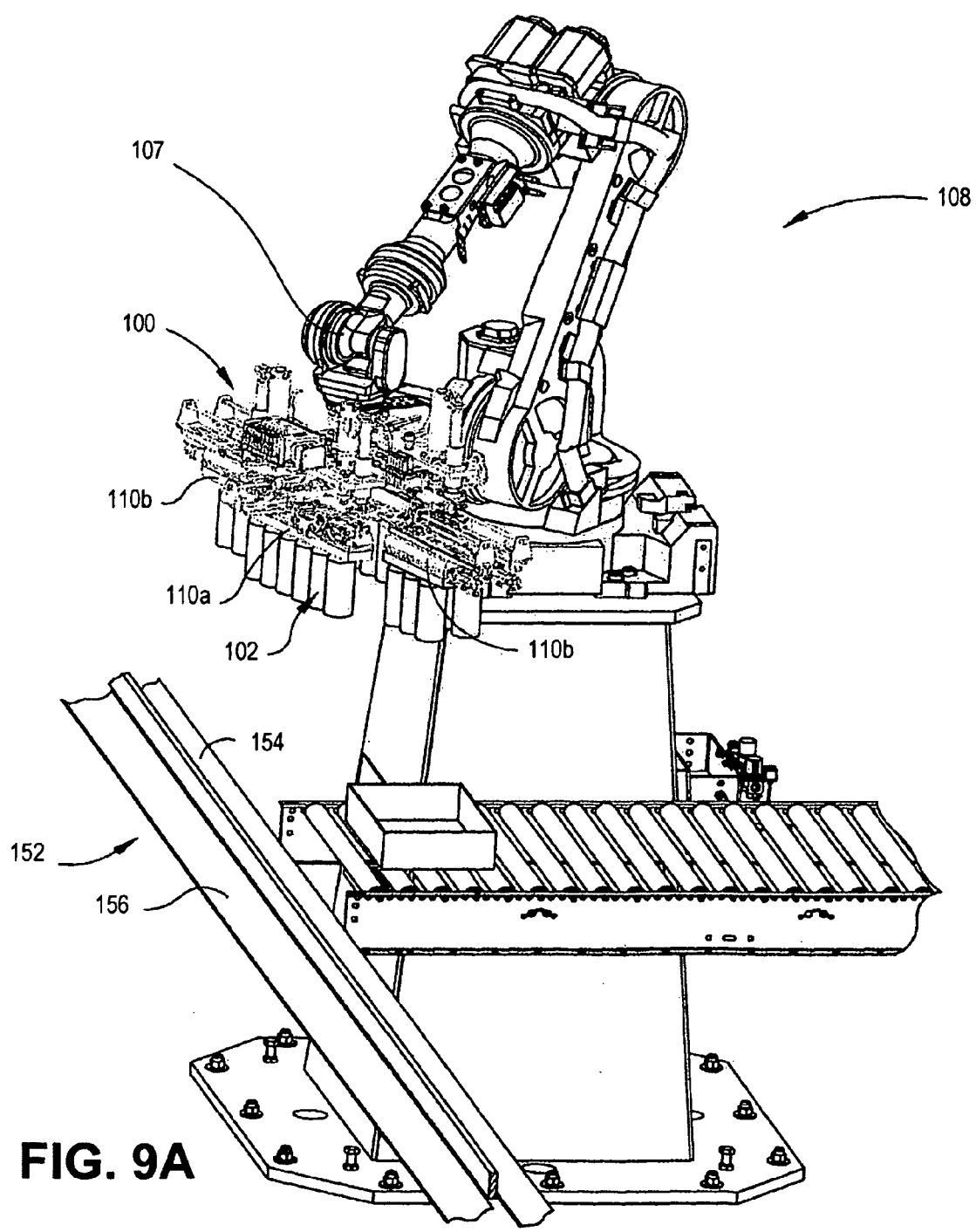
FIG. 9A is an isometric view of the robotic tool of FIG. 5 further reconfiguring the plurality of articles.
Figure 9B:
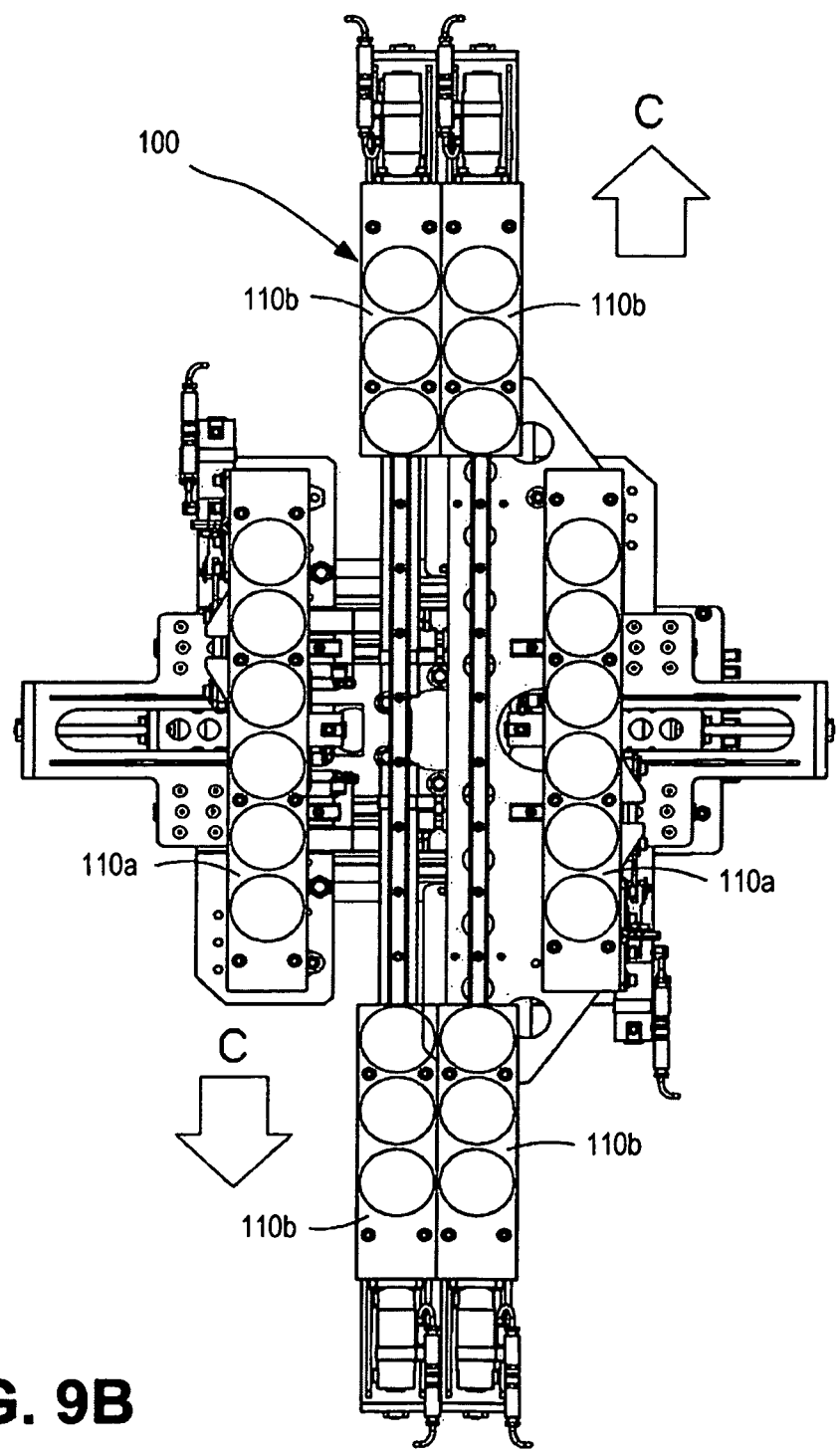
FIG. 9B is a bottom view of the robotic tool of FIG. 9A showing the robotic tool further reconfiguring the articles.

As shown in FIGs. 9A and 9B, second gripper assemblies 110b are each moving outward along directional arrows C from between the spread apart first gripper assemblies 110a. The movement of the second gripper assemblies 110b along directional arrows C has created a gap between formerly juxtaposed second gripper assemblies 110b. FIG. 9B is a bottom view of the robotic tool 100 of FIG. 9A and the directional arrows C are shown therein.

Figure 10:
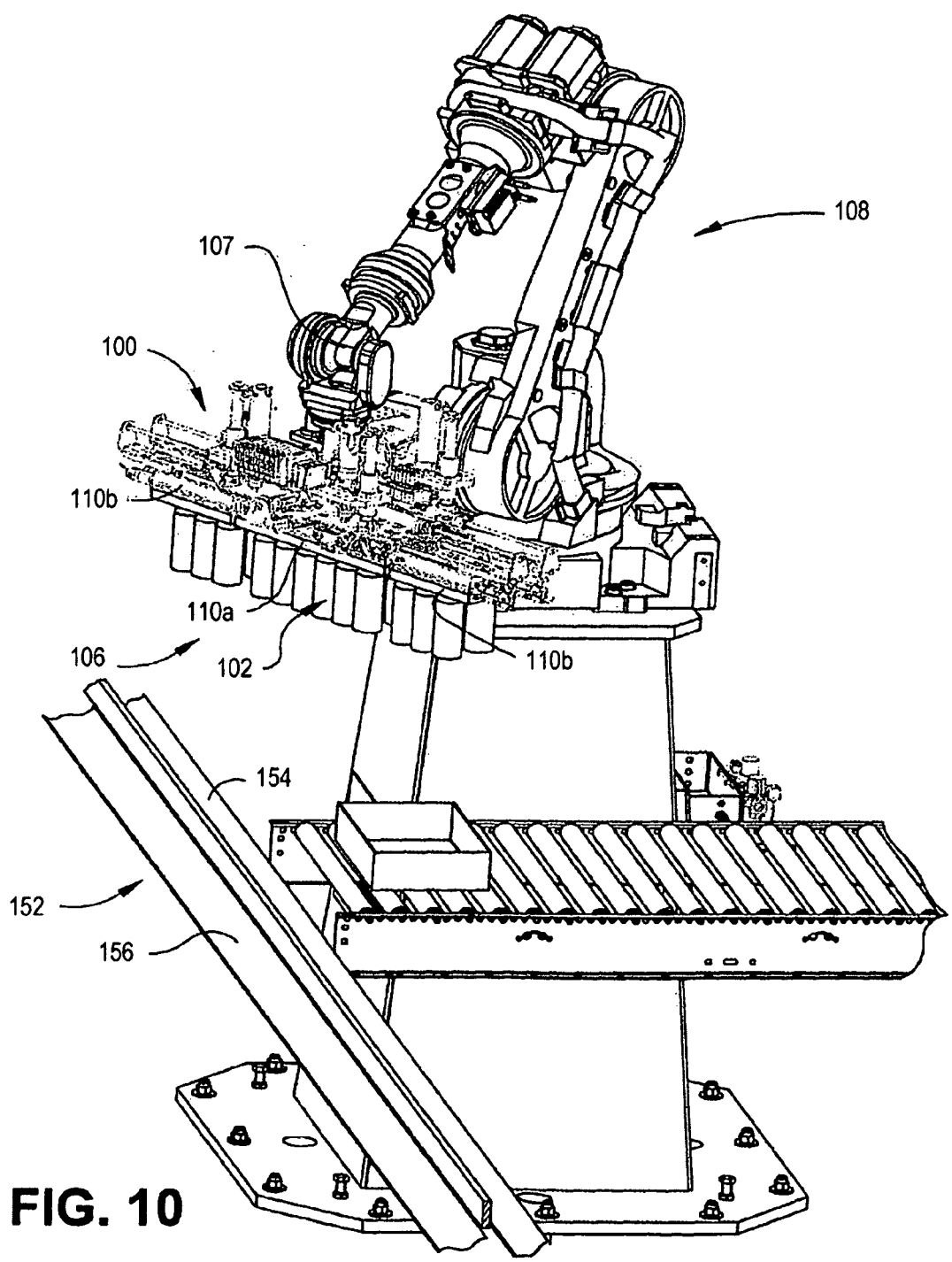
FIG. 10 is an isometric view of the robotic tool of FIG. 5, showing the plurality of articles reorganized to a second configuration.

FIG. 10 shows articles 102 held by first gripper assemblies 110a moved into the gap between second gripper assemblies 110b. The movement of the articles 102 held by first gripper assemblies 110a into the gap has moved the articles 102 into the second configuration 106.

Figure 11:
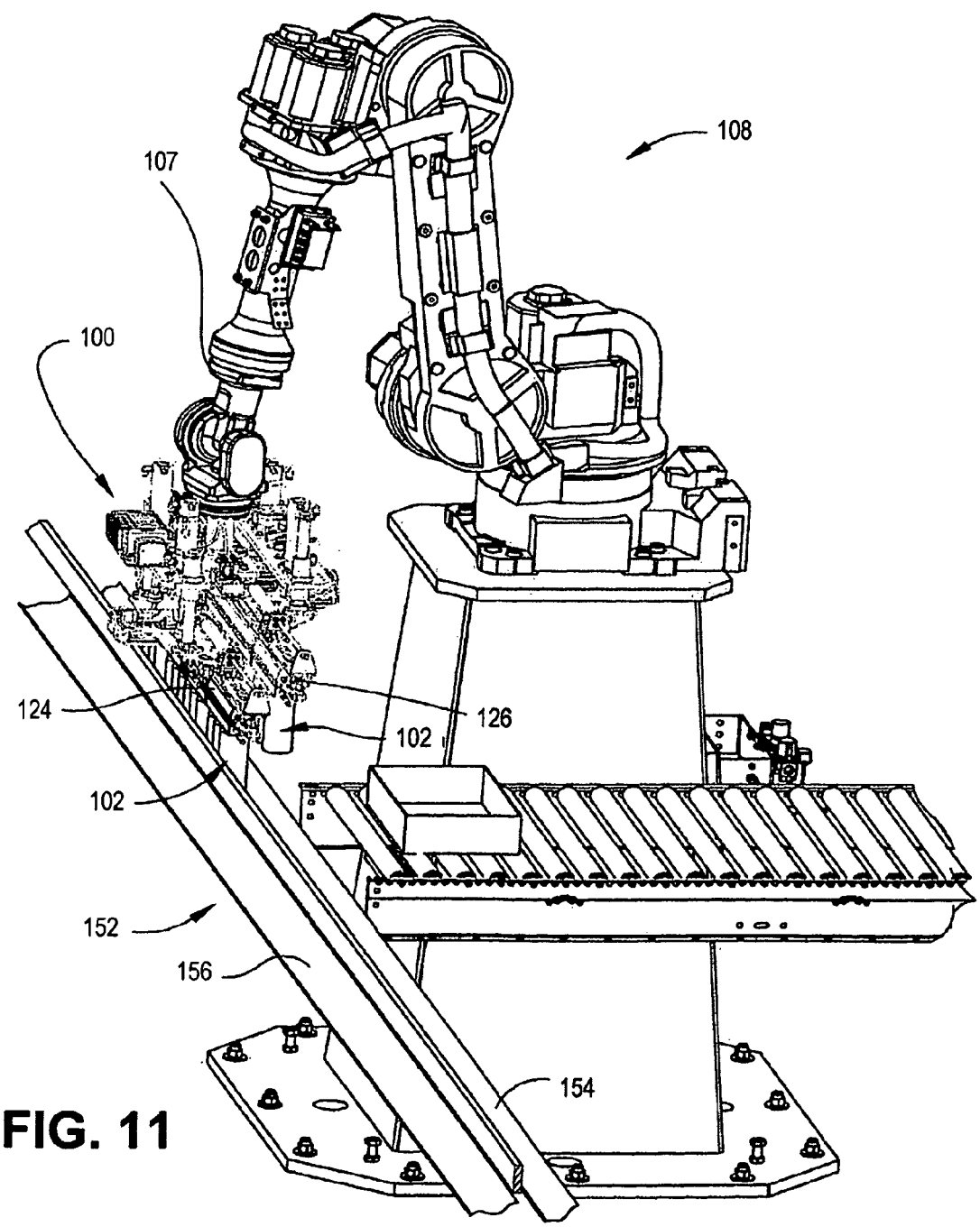
FIG. 11 is an isometric view of the robotic tool of FIG. 5 placing the plurality of articles onto the conveyor in the second configuration.

As seen in FIG. 11, robotic arm 108 has been rotated counterclockwise to position articles 102 held by first pickup assembly 124 directly over the conveyor belt 154. Robotic arm 108 has also moved robotic tool 100 down to a position where the articles 102 held by first pickup assembly 124 were suspended above the conveyor belt 154. Pickup actuator 128 was actuated to extend first pickup assembly 124 to place down articles 102 held within first pickup assembly 124 onto conveyor belt 154 of second conveyor 152. Once articles 102 are placed onto conveyor belt 154, gripper assemblies 110a-110b associated with the extended first pickup assembly 124 may then release articles 102.

Figure 12:
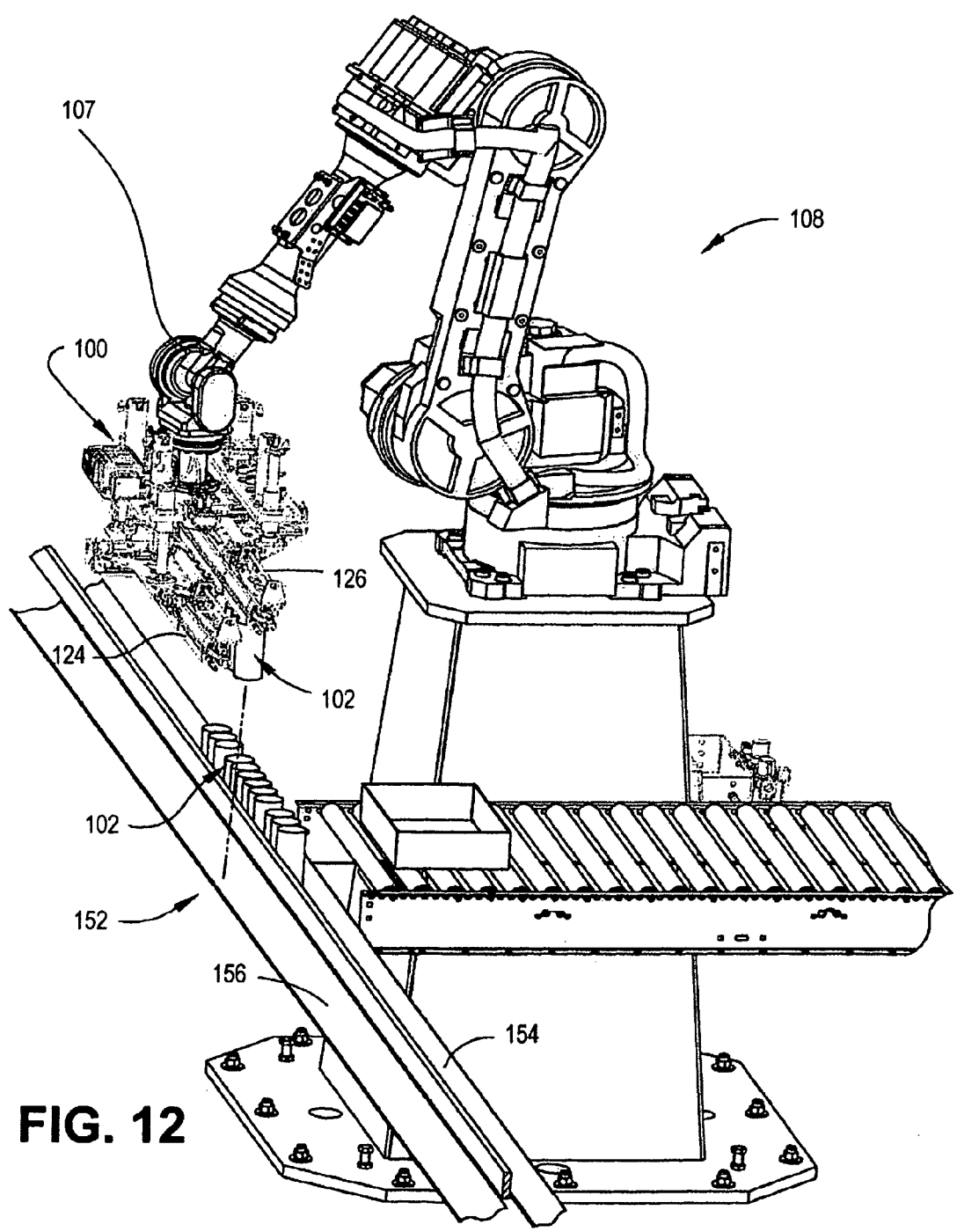
FIG. 12 is an isometric view of the robotic tool of FIG. 5 releasing the plurality of articles.

As shown in FIG. 12, after releasing articles 102 from first pickup assembly 124, robotic arm 108 has moved robotic tool 100 upwards away from the conveyor belt 154 and has moved robotic tool 100 towards conveyor belt 156 to position the articles 102 held by second pickup assembly 126 over the conveyor belt 156. A line of motion of the articles 102 is indicated by the dashed line.

Figure 13:
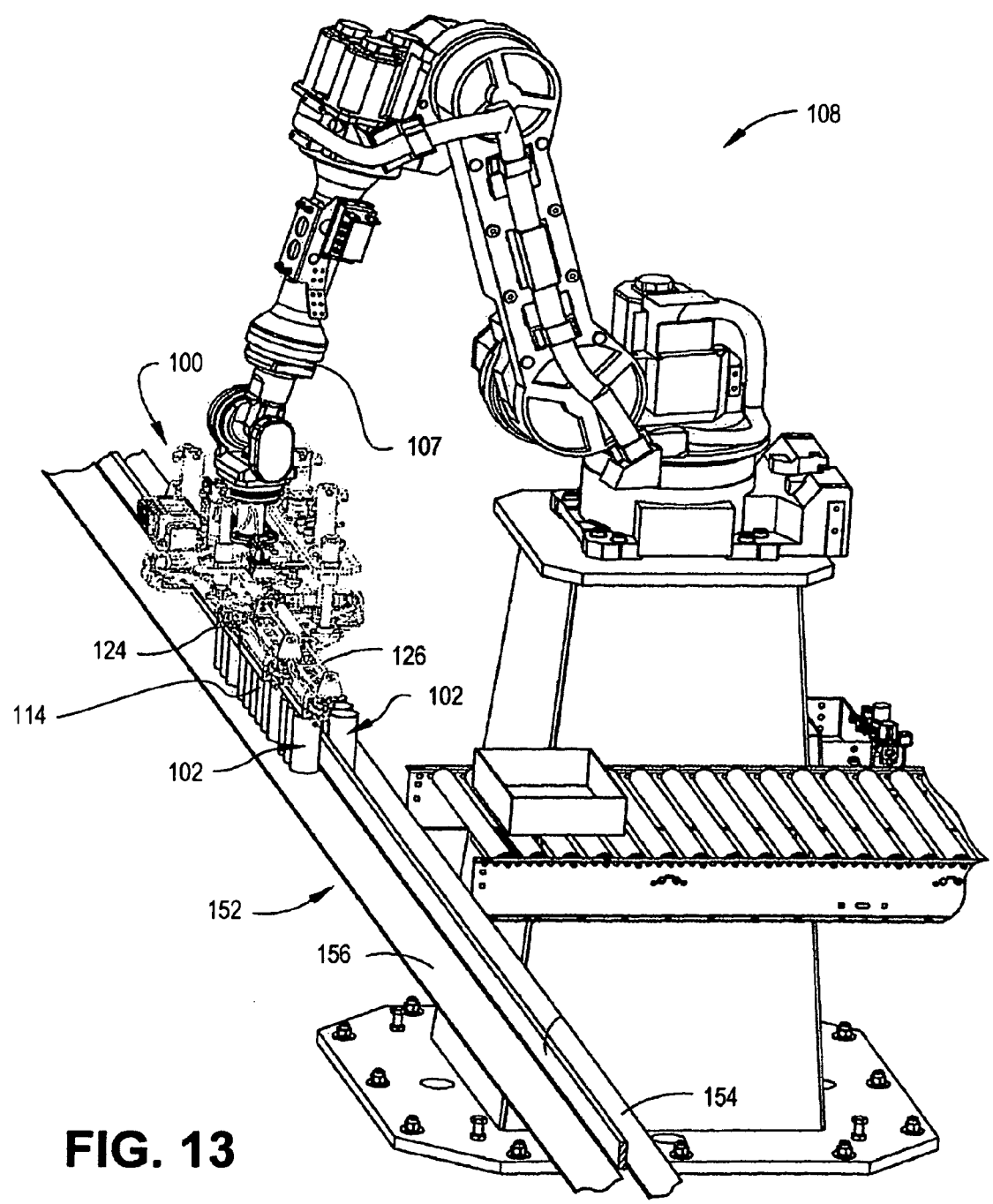
FIG. 13 is an isometric view of the robotic tool of FIG. 5 placing a second plurality of articles onto a second conveyor in a third configuration.
Figure 14:
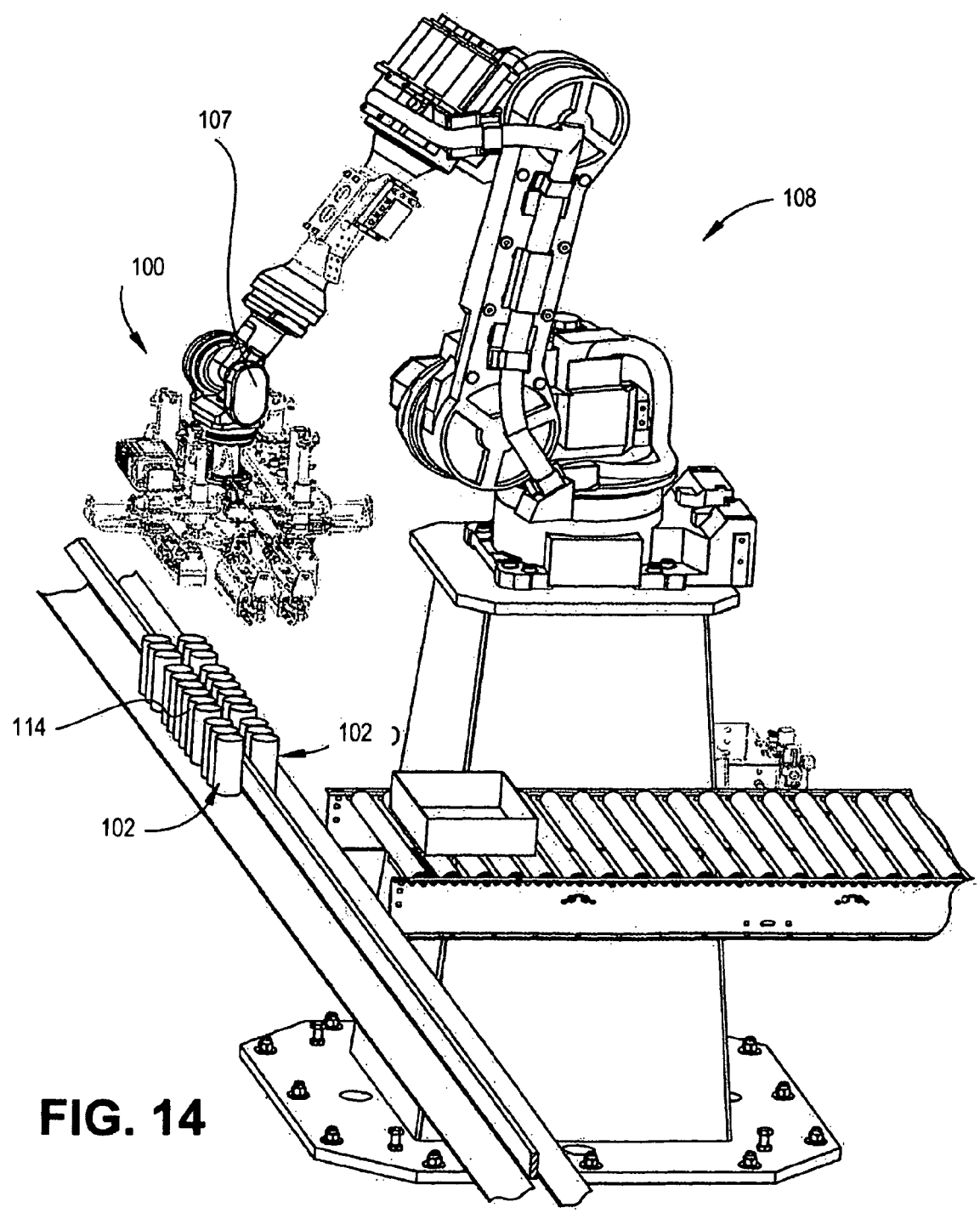
FIG. 14 is an isometric view of the robotic tool of FIG. 5 releasing the second plurality of articles.

As seen in FIG. 13, robot arm 108 has moved robotic tool 100 down to a position over the conveyor belt 156. Pickup actuators 128 associated with first pickup assembly 124 have retracted first pickup assembly 124 towards robotic tool 100. Pickup actuators 128 associated with second pickup assembly 126 have extended second pickup assembly 126 towards robotic tool 100 to place articles 102 held within second pickup assembly 126 on conveyor belt 156 of second conveyor 152. Gripper assemblies 110a-110 b may then release articles 102 and second pickup assembly 126 may be retracted to move second pickup assembly 126 away from articles 102, as shown in FIG. 14. First and second pickup assemblies 124 126 may also be actuated simultaneously to place articles 102 on second conveyor 152 at the same time. Accordingly, articles 102 may be moved from first conveyor 146 in first configuration 104 to second conveyor 152 in second configuration 106.

Alternately, first and second gripper assemblies 110a-110b may grasp articles 102 at the first location on first conveyor 146, and may move articles 102 from the first location to a second location, which may be different from the first location. For instance, robotic tool 100 can move articles 102 to second conveyor 152.

Articles 102 are shown as a container or can of one size but are not limited thereto. In other embodiments, the articles 102 of the present invention may be bottles, boxes or any other shaped container. As shown, gripping tool 116 can use grip 150 to engage with and pick up flat topped containers of a certain size. In this embodiment, grip 150 is configured to engage a flat top or part of the article 102. In another embodiment, the grip 150 can be an elastomeric insert that can be easily attached to gripper assemblies 110 to engage a different sized or shaped container. This offers the ability to rapidly replace lost or damaged grips 150, and the ability to replace grips 150 for a grip 150a that is configured to engage with an article having a different shape. One example of a different shape may be a long necked bottle but is not limited thereto. For the long necked bottle, grip 150a may engage the neck of the bottle. This enables customers to easily switch robotic tool 100 from one product of one shape to another product of another shape. Controller 50 can contain more than one article configuration internally so that the customer can also switch robotic tool 100 to engage with articles 102 of a different size, shape and configuration. Accordingly, the present innovation can provide features and benefits such as (i) reduced labor costs, (ii) increased article throughput; (iii) organize and package articles for transit; (iv) perform complicated maneuvers of articles into more usable configurations; (v) offer flexibility to create different article configurations with the same robotic tool; (vii) have easily replaceable inserts that can be rapidly changed to manipulate different types or sizes of articles; and/or (viii) use vacuum for reliable pickup and release of articles.

The foregoing description of an embodiment has been presented for purposes of illustration and description. It is not intended to be exhaustive or to limit the invention to the precise form disclosed. Obvious modifications or variations are possible in light of the above teachings. The embodiment was chosen and described in order to best illustrate the principles of the invention and its practical application to thereby enable one of ordinary skill in the art to best utilize the invention in various embodiments and with various modifications as are suited to the particular use contemplated. Although only a limited number of embodiments of the invention are explained in detail, it is to be understood that the invention is not limited in its scope to the details of construction and arrangement of components set forth in the preceding description or illustrated in the drawings. The invention is capable of other embodiments and of being practiced or carried out in various ways. Also, specific terminology had been used for the sake of clarity. To the extent that the term "includes" is used in either the detailed description or the claims, such term is intended to be inclusive in a manner similar to the term "comprising" as "comprising" is interpreted when employed as a transitional word in a claim. It is to be understood that each specific term includes all technical equivalents which operate in a similar manner to accomplish a similar purpose. It is intended that the scope of the invention be defined by the claims submitted herewith.

What is claimed is:
1. A robotic tool attached to a robotic arm for reconfiguring articles between a first configuration of a packaged array to a second configuration of a conveyed array, the robotic tool comprising:
    a mounting structure coupled to a movable end of the robotic arm;

a first gripper assembly having more than one gripping tool to each grasp an article and comprising a first horizontal guide coupled for translational movement to the mounting structure;

a first actuator connected between the mounting structure and the first gripper assembly to move the first gripper assembly along the first horizontal guide;

a second gripper assembly having more than one gripping tool to each grasp an article and comprising a second horizontal guide oriented orthogonally to the first horizontal guide and coupled for orthogonal translational movement to the mounting structure; and a second actuator oriented orthogonally to the first actuator and connected between the mounting structure and the second gripper assembly to move the second gripper assembly along the second horizontal guide, wherein the respective first and second gripper assemblies can be oriented in a first orientation at a first location and a second orientation at a second location, wherein the first and second orientations comprise different of rows and/or columns.

2. The robotic tool of claim 1, wherein the first configuration and the second configuration comprise at least one row of gripping tools and at least one column of gripping tools, and the first configuration comprises a greater number of rows of gripping tools than the second configuration.

3. The robotic tool of claim 2, wherein when the gripping tools are in the first configuration, the gripping tools comprise at least one inner row of gripping tools between outer rows of gripping tools.

4. The robotic tool of claim 3, wherein the first gripper assembly is configured to move at least part of an inner row of gripping tools outward and the second gripper assembly is configured to move at least part of an outer row of gripping tools inward behind and in alignment with the outwardly moved inner row of the first gripper assembly.

5. The robotic tool of claim 2, wherein at least two rows of gripping tools are parallel.

6. The robotic tool of claim 2, wherein at least two columns of gripping tools are parallel.

7. The robotic tool of claim 2, wherein the plurality of grippers comprise a first gripper and a second gripper and each of first gripper and second gripper have a different number of gripping tools than the other.

8. The robotic tool of claim 2, wherein each of the plurality of gripping tools are configured to engage the articles with vacuum.

9. The robotic tool of claim 2, wherein each of the gripping tools can further comprise a replaceable grip configured to engage with an article.

10. The robotic tool of claim 1, wherein the mounting structure comprises a first bottom mounting structure, the robotic tool further comprising an upper head assembly having a top mounting structure and a first pickup assembly comprising:

at least one pickup guide attached to the top mounting structure and received for vertical sliding engagement to the first bottom mounting structure; and at least one pickup actuator attached between the top and first bottom mounting structures to vertically position the bottom mounting structure and first and second gripper assemblies relative to the upper head assembly.

11. The robotic tool of claim 1, further comprising:

a third gripper assembly having more than one gripping tool to each grasp an article and comprising a third horizontal guide aligned with the first horizontal guide, oriented orthogonally to the second horizontal guide, and coupled for orthogonal translational movement to the mounting structure opposite to the first horizontal guide; and a third actuator aligned with the first horizontal guide, oriented orthogonally to the first actuator and connected between the mounting structure and the third gripper assembly to move the third gripper assembly along the third horizontal guide, wherein the respective first and third gripper assemblies can be oriented in a first orientation together and a second orientation spaced apart sufficient for the second gripper assembly to be positioned there between, wherein the first and third gripper assemblies together comprise a full row of gripping tools and the second gripper assembly comprises a full row of gripping tools.

12. The robotic tool of claim 11, wherein the mounting structure comprises a first bottom mounting structure, the robotic tool further comprising an upper head assembly having a top mounting structure and a first pickup assembly comprising:

at least one pickup guide attached to the top mounting structure and received for vertical sliding engagement to the bottom mounting structure; and at least one pickup actuator attached between the top mounting structure and the first bottom mounting structure to vertically position the first bottom mounting structure and first, second and third gripper assemblies relative to the upper head assembly.

13. The robotic tool of claim 12, the first pickup assembly, first bottom mounting structure, first, second and third gripper assemblies, first, second and third horizontal guides, and first, second and third actuators comprise a right hand portion of an end effector, the robotic tool further comprising a left hand portion of the end effector that is laterally mirrored in configuration to the right hand portion.

* * * * *